(12) United States Patent
Bhatia et al.

(10) Patent No.: US 7,325,213 B2
(45) Date of Patent: Jan. 29, 2008

(54) NESTED DESIGN APPROACH

(75) Inventors: Harsaran S. Bhatia, Hopewell Junction, NY (US); Marie S. Cole, Wappingers Falls, NY (US); Michael S. Cranmer, Poughkeepsie, NY (US); Jason Lee Frankel, Beacon, NY (US); Eric Kline, Clinton Corners, NY (US); Kenneth A. Papae, Hopewell Junction, NY (US); Paul R. Walling, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 11/160,307

(22) Filed: Jun. 17, 2005

(65) Prior Publication Data
US 2005/0278674 A1    Dec. 15, 2005

Related U.S. Application Data

(63) Continuation of application No. PCT/US02/40671, filed on Dec. 18, 2002.

(51) Int. Cl.
*G06F 17/50* (2006.01)
(52) U.S. Cl. .......................................... 716/10; 716/12
(58) Field of Classification Search ............... 716/8–12
See application file for complete search history.

(56) References Cited

U.S. PATENT DOCUMENTS

| | | | |
|---|---|---|---|
| 5,953,236 A | 9/1999 | Hossain et al. | |
| 6,327,695 B1 * | 12/2001 | Bothra et al. | 716/8 |
| 6,340,542 B1 | 1/2002 | Inoue et al. | |
| 6,581,189 B1 * | 6/2003 | Tain | 716/3 |
| 6,597,362 B1 * | 7/2003 | Norman | 345/505 |
| 6,618,847 B1 * | 9/2003 | Hulse et al. | 716/8 |
| 6,629,291 B1 * | 9/2003 | Houghton et al. | 716/1 |
| 7,065,721 B2 * | 6/2006 | Pekin et al. | 716/2 |

* cited by examiner

*Primary Examiner*—Jack Chiang
*Assistant Examiner*—Binh Tat
(74) *Attorney, Agent, or Firm*—Wenjie Li; Ira D. Blecker (57) ABSTRACT

A structure for a system of chip packages includes a master substrate and at least one subset substrate of the master substrate. The subset substrate includes a portion of the master substrate that has an identical pin out pattern as the portion of the master substrate. The subset substrate has identical internal net lists as the portion of the master substrate. The subset substrate is adapted to accommodate a smaller chip than the master substrate. The master substrate is the largest substrate in the system. The invention also prepares a system of chip packages. The invention selects a master substrate and then selects a subset substrate of the master substrate.

10 Claims, 14 Drawing Sheets

NESTED DESIGN APPROACH

This is a continuation of PCT Application Number PCT/US02/040671 filed 18 Dec. 2002.

BACKGROUND OF THE INVENTION

1. Field of the Invention

The present invention generally relates to chip package designs and more particularly to an improved design that pre-assigns the contact pad array pattern and associated net list for a family of chips.

2. Description of the Related Art

Semiconductor chips are generally encased in packages that are attached to a printed circuit board. The packages protect the chip from environmental degradation and form electrical power and signal connections to the printed circuit board. The chips generally perform different functions some of which are less complex than others. Therefore, the chips often have different sizes (sometimes relating to their complexity).

One problem encountered by designers is that each chip package (substrate) must be uniquely designed for each newly designed chip. This is true for even those chips that are in the same family (same family corresponding to the same technology node and device type, and sometimes extending to the same topology and/or I/O structure and pinout). The invention described below overcomes such problems by utilizing pre-assigned pin-out patterns on the chip packages.

SUMMARY OF THE INVENTION

In view of the foregoing and other problems, disadvantages, and drawbacks of the conventional chip packages and associated design methodology limitations, the present invention has been devised, and it is an object of the present invention to provide a structure and method for an improved chip package and design methodology.

There is provided, according to one aspect of the invention, a menu of chip packages that have a master substrate and at least one subset substrate of the master substrate. The subset substrate is a portion of the master substrate and has an identical pin out pattern as that portion of the master substrate. The subset substrate has identical internal net lists as that portion of the master substrate. The subset substrate is adapted to accommodate a smaller chip than the master substrate. The master substrate is the largest substrate in the menu. The invention also prepares a menu of chip packages. The invention selects a master substrate and then selects a subset substrate of the master substrate.

The master design represents the largest possible logical netlist and largest physical wiring possible for the given die and package combination. Further, the logical netlist is not changed or revised in any way except that programmatic (e.g., from the outermost I/O proceeding inboard, in series, as required) deletions are allowed. Thus, the derived subordinate netlist/package is an exact identical subset of the parent master netlist/package.

Thus, as explained above, when different sizes of chips from the same family are placed on multiple substrate sizes, the invention designs the substrate with the largest body size first. Designs for the smaller body sizes are then subsets of the initial design. The bottom surface pad assignments for each physical location are made common between each substrate size to enable this sharing of design structures to produce the cost and time savings associated with the invention.

Traditionally, each substrate design has been done from scratch, which utilizes much more design resources, and requires a long cycle time to produce each design or netlist. With the invention, the subset netlists can be delivered to the customer much more quickly, by just running through a program to obtain the subset netlist, and the smaller designs can quickly be obtained, reducing the design cycle time.

BRIEF DESCRIPTION OF THE DRAWINGS

The foregoing and other objects, aspects and advantages will be better understood from the following detailed description of preferred embodiments of the invention with reference to the drawings, in which:

FIGS. 13A and 134B are schematic diagrams of the second internal layer wiring of the V2 power level connections for the chip package using the master netlist and a subset netlist of the master netlist.

DETAILED DESCRIPTION OF PREFERRED EMBODIMENTS OF THE INVENTION

As mentioned above, the invention reduces the amount of design time and effort required which allows new products to be brought to the market earlier and reduces the cost of creating such products. Generally, the invention designs the wiring connections of a package to allow that package to be used generically with a wide variety of semiconductor chips. The invention creates a master (or super-substrate) design the of the largest substrate (chip package) that will be included within a menu of substrates. Substrates that are smaller than the master substrate are subsets of the master design. Thus, the invention represents both an improved design methodology, wherein design reuse of the super-substrate is supported for all design subsets therefor, and an improved package, whereupon multiple new packages for multiple die (chips) of different sizes, pursuant to common netlist hierarchy (I/O and functional) considerations, may be extracted from the super-substrate by a simple programmatic deletion of nets.

Therefore, once the master design is completed, smaller substrates can be created by programmatically deleting net lists from the larger master substrate. With the invention, the pin-out from the top of the substrate (at the flip-chip bumps) to the bottom of the substrate (at the bottom surface metallurgy (BSM) pads) is predetermine for a menu of substrates. Thus, with the invention, the pattern of the BSM pads is pre-assigned for all substrates (packages) within a given menu and there is no need to customize the substrates for each different chip. This is possible by virtue of the improved design re-use methodology wherein the super-substrate netlist is a logical super-set of inferior (smaller, subordinate) netlists, and the physical topology of the I/O (both TSM and BSM planes) support the logical deletion of unneeded nets for subordinate packages. Such logical or programmatic deletion of unneeded nets is predicated upon a 3-D fanout of said nets through the package such that the outermost I/O at the TSM plane remains the outermost row at the BSM plane (thus, the nets do not physically cross). This procedure supports the programmatic deletion of nets in derived packages of subordinate chips in that nets corresponding to chip I/Os from the outermost periphery of the die are deleted first and deletion continues inboard to more internal I/O as required.

Figure 1:
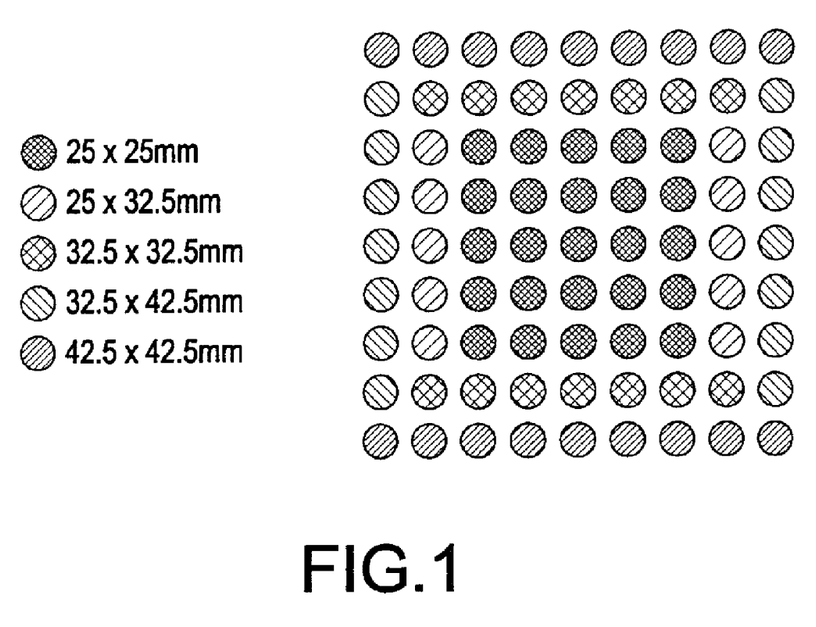
FIG. 1 is a schematic diagram of different ball grid array patterns which shows how the smaller chip package array patterns are subsets of the array pattern of the master.

For example, as shown in FIG. 1, the BSM design of a master substrate is shown. In this example, the master substrate has a size of 42.5×42.5 mm. In addition, FIG. 1 illustrates a number of subsets of the master substrate (shown in different scaling) down to the smallest substrate which is 25×25 mm. As shown in FIG. 1, in order to create a subset of the master substrate, it is only necessary to remove selected portions of the master substrate. The remaining BSM pads do not need to be redesigned, nor do the electrical connections which are formed above the BSM pads need to be redesigned. The substrate could comprise ceramic, organic, plastic, semiconductor, etc.

Figure 2A:
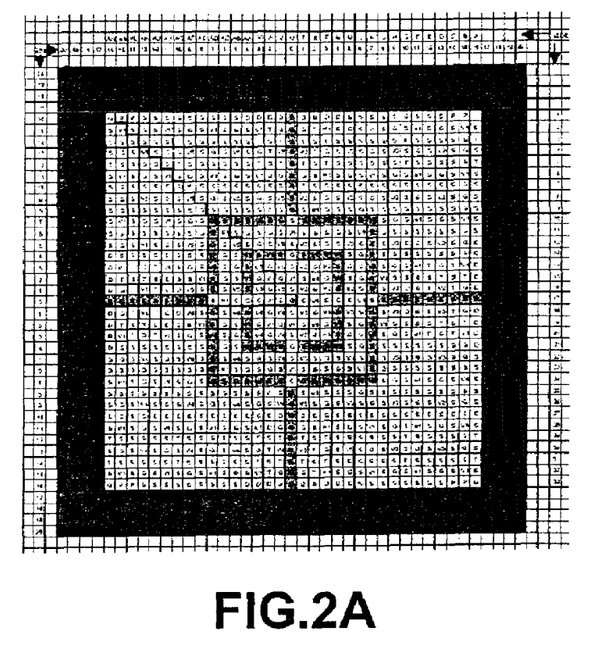
FIGS. 2A and 2B are schematic diagrams of the BSM assignments of the chip package using the master netlist and the BSM assignments of the chip package using a subset netlist of the master netlist.
Figure 2B:
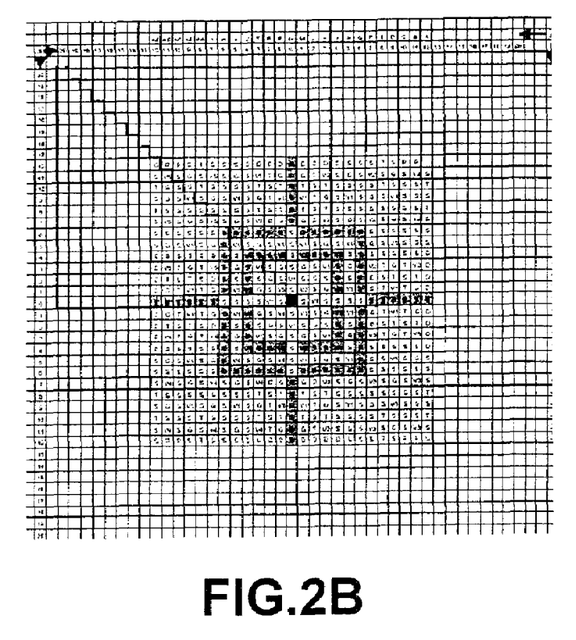
Figure 3A:
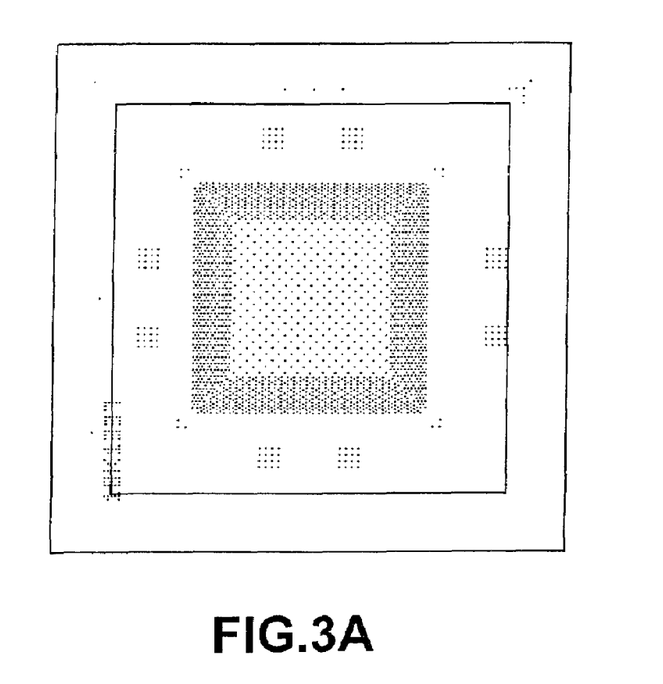
FIGS. 3A and 3B are schematic diagrams of the die footprint on the TSM of the master netlist and a subset netlist of the master netlist.
Figure 3B:
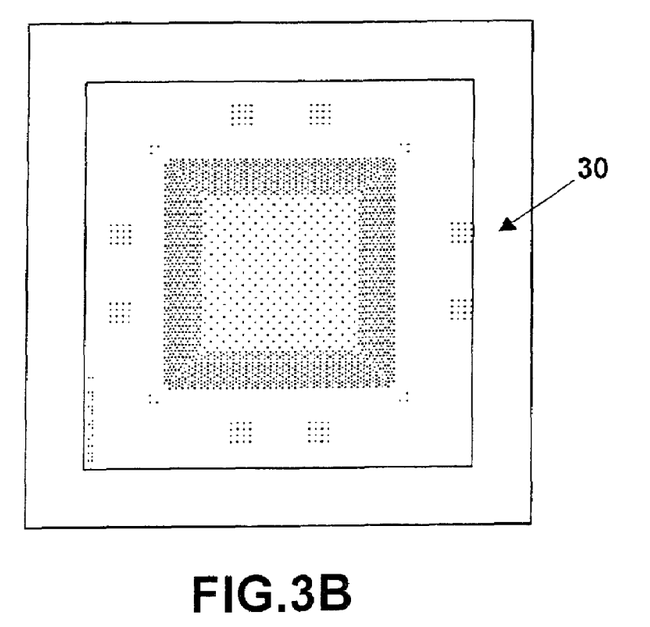
Figure 4A:
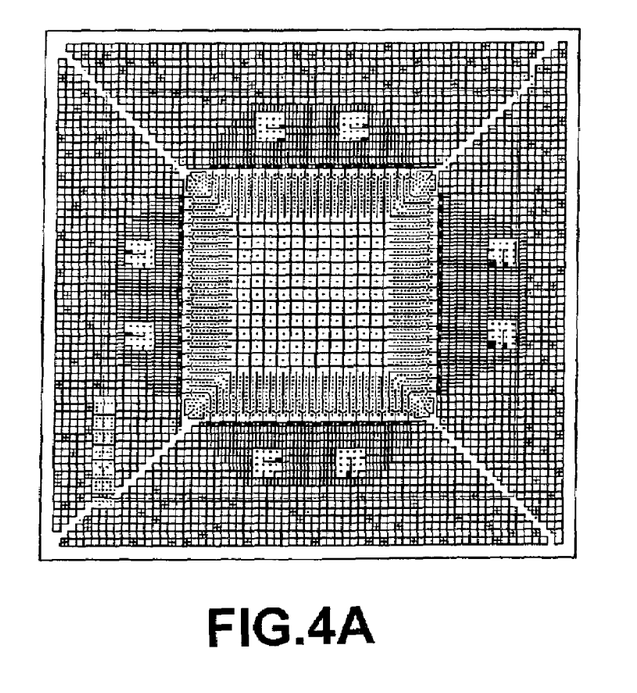
FIGS. 4A and 4B are schematic diagrams of the first internal layer wiring of the V2 power level connections for the chip package using the master netlist and a subset netlist of the master netlist.
Figure 4B:
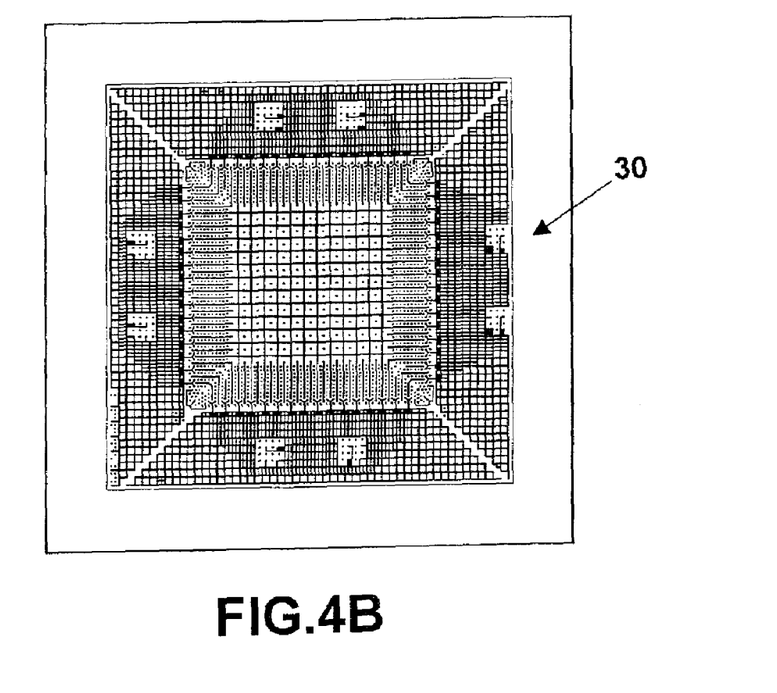
Figure 5A:
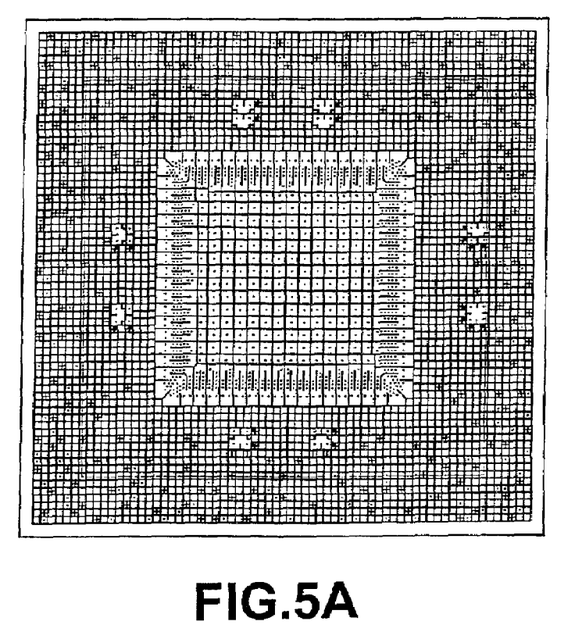
FIGS. 5A and 5B are schematic diagrams of the first internal layer wiring of the ground connections for the chip package using the master netlist and a subset netlist of the master netlist.
Figure 5B:
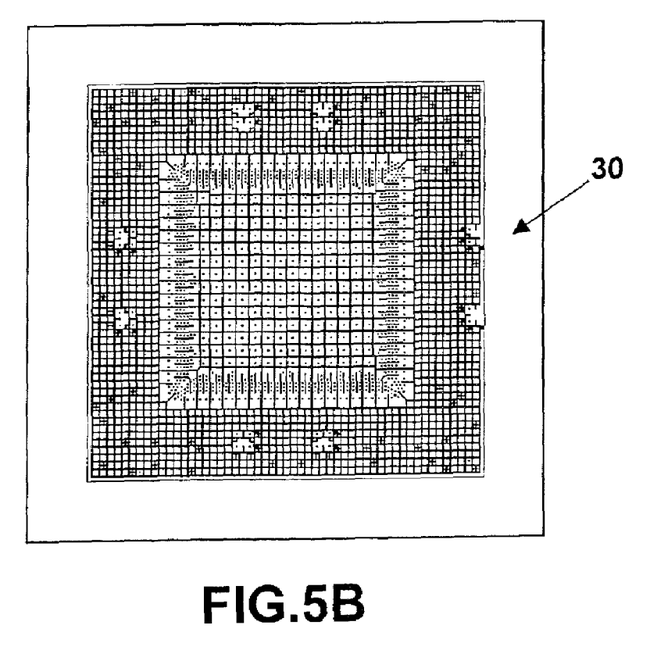
Figure 6A:
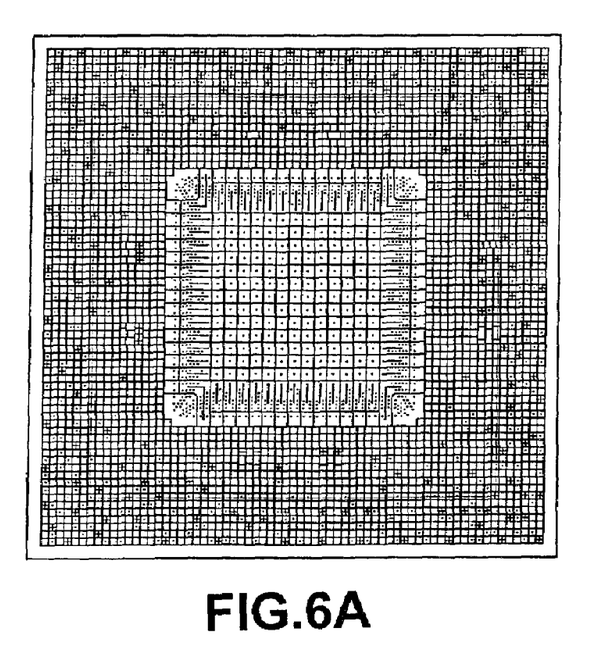
FIGS. 6A and 6B are schematic diagrams of the first internal layer wiring of the V1 power level connections for the chip package using the master netlist and a subset netlist of the master netlist.
Figure 6B:
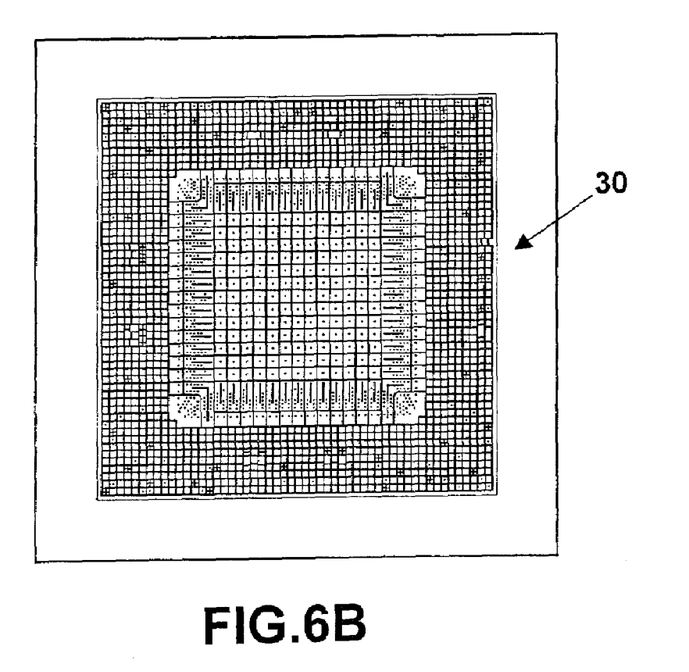
Figure 7A:
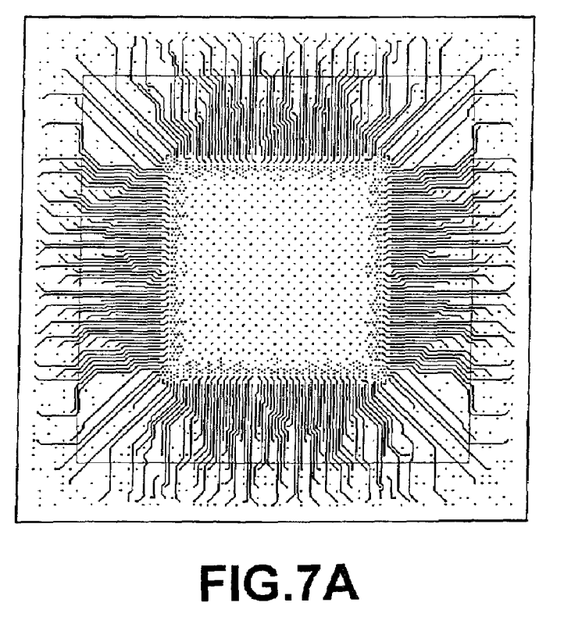
FIGS. 7A and 7B are schematic diagrams of the first internal layer wiring of the signal connections for the chip package using the master netlist and a subset netlist of the master netlist of an intermediate level within a chip package.
Figure 7B:
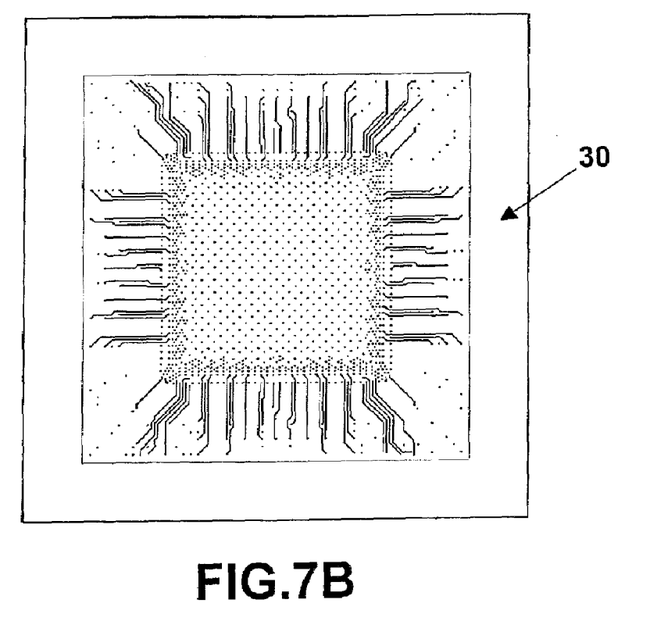
Figure 8A:
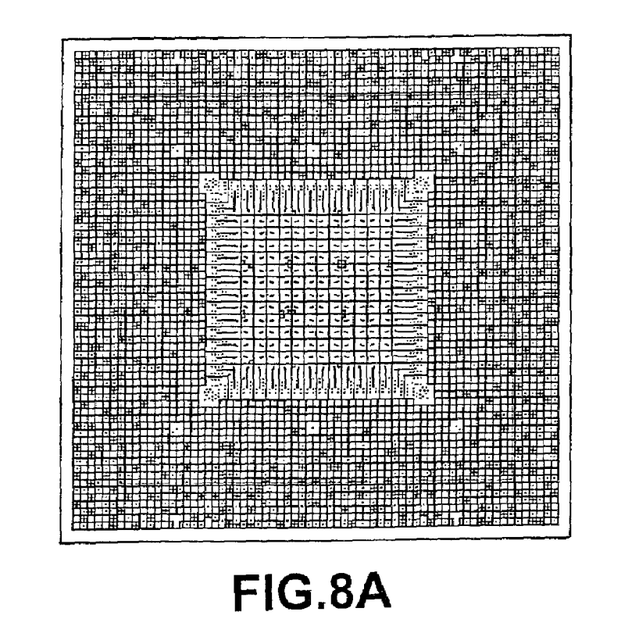
FIGS. 8A and 8B are schematic diagrams of the second internal layer wiring of the ground connections for the chip package using the master netlist and a subset netlist of the master netlist.
Figure 8B:
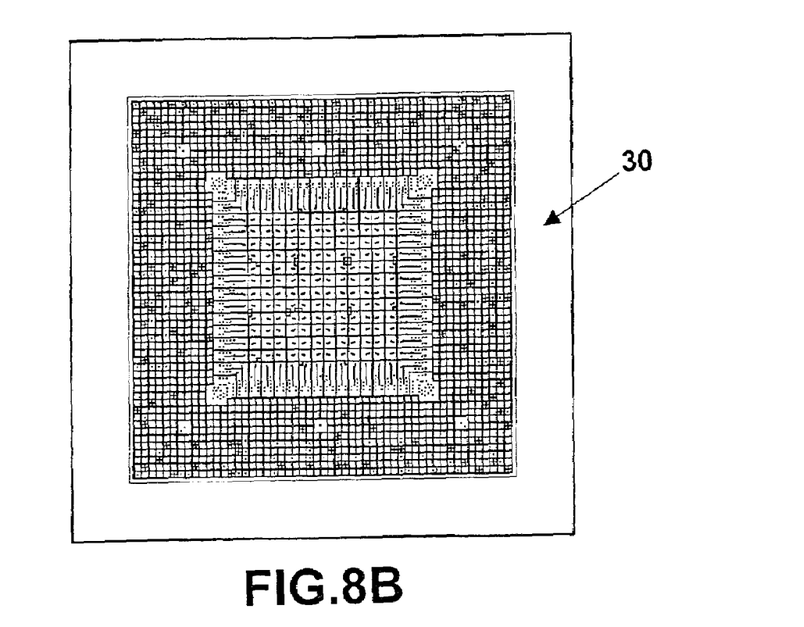
Figure 9A:
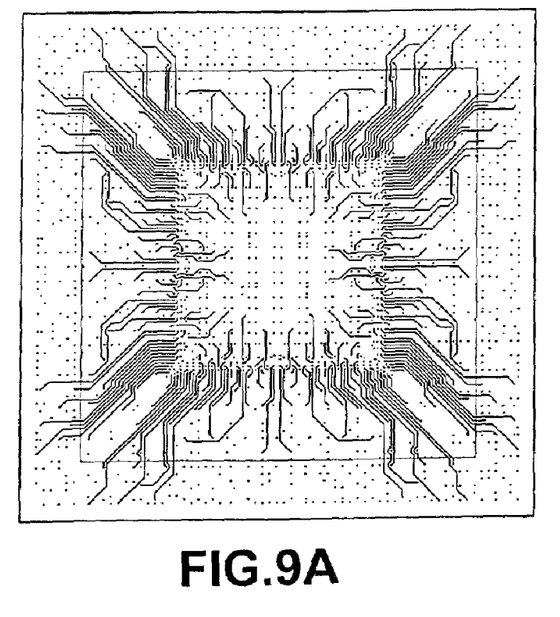
FIGS. 9A and 9B are schematic diagrams of the second internal layer wiring of the signal connections for the chip package using the master netlist and a subset netlist of the master netlist.
Figure 9B:
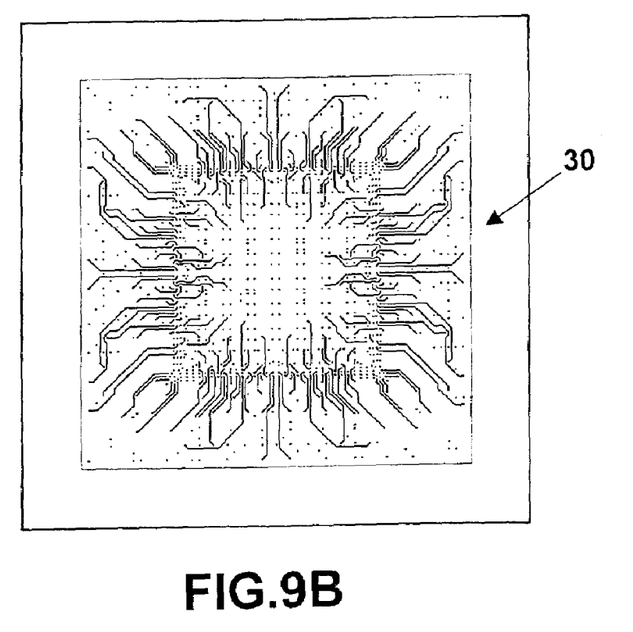
Figure 10A:
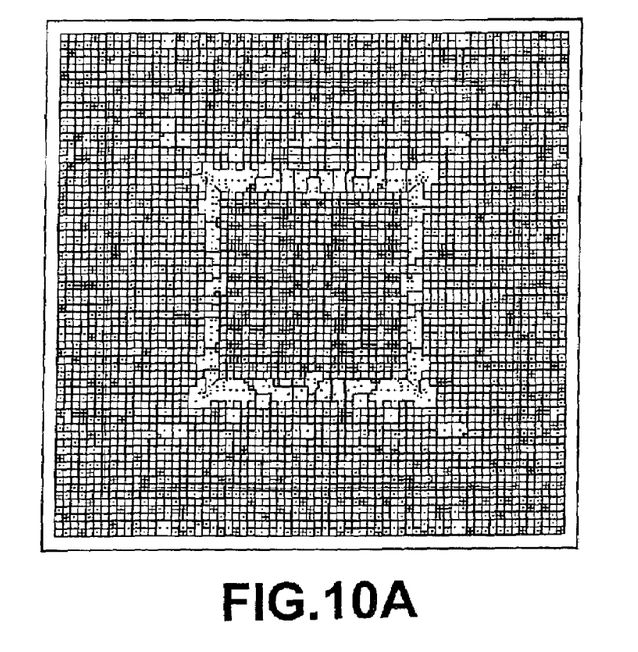
FIGS. 10A and 10B are schematic diagrams of the second internal layer wiring of the V1 power level connections for the chip package using the master netlist and a subset netlist of the master netlist.
Figure 10B:
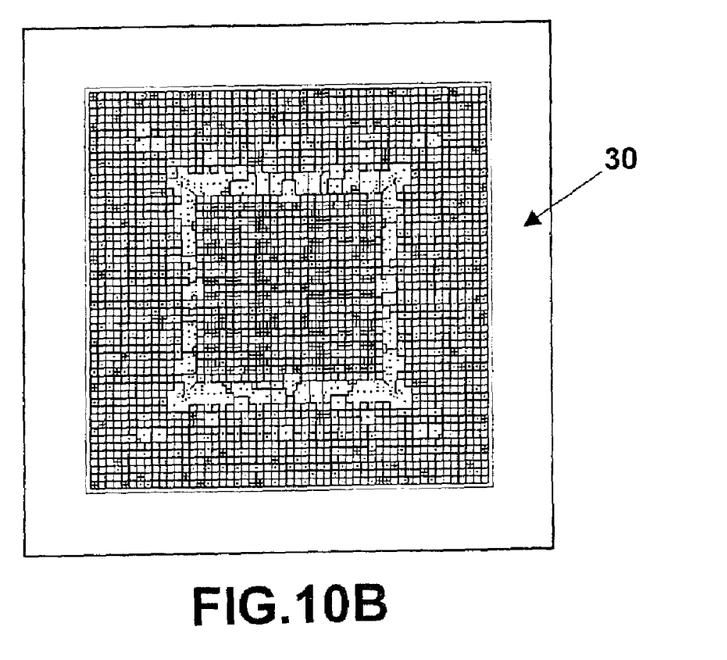
Figure 11A:
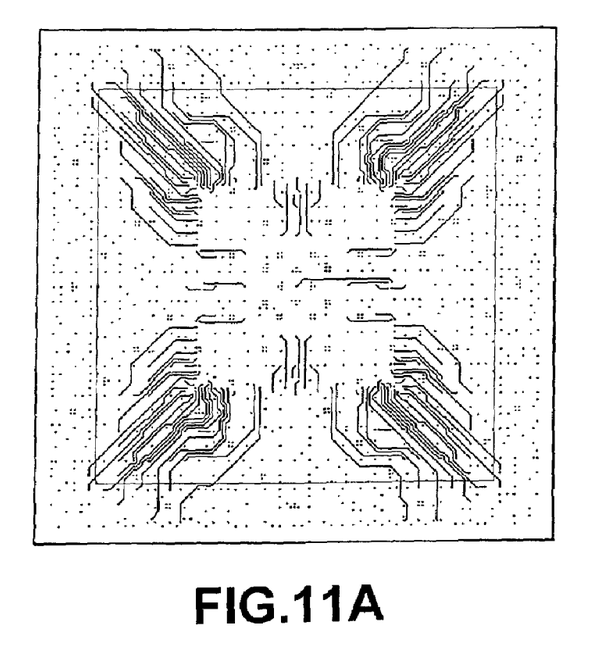
FIGS. 11A and 11B are schematic diagrams of the third internal layer wiring of the signal connections for the chip package using the master netlist and a subset netlist of the master netlist.
Figure 11B:
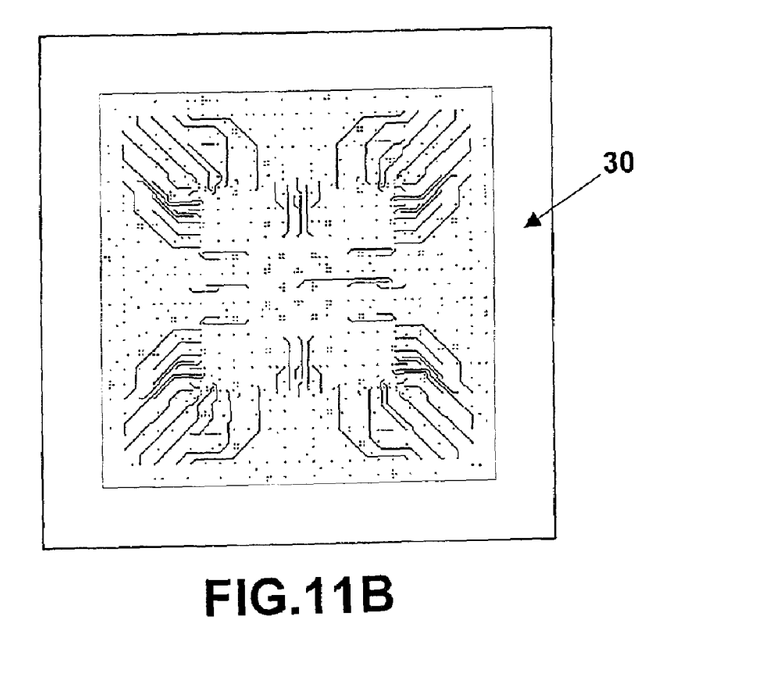
Figure 12A:
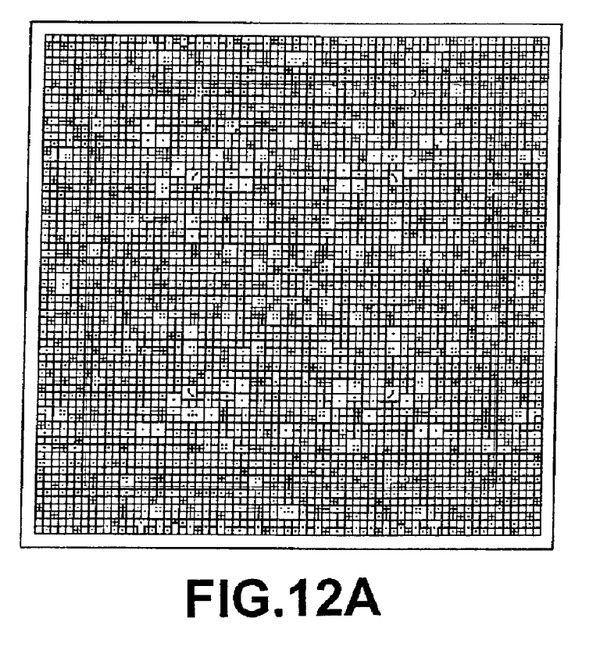
FIGS. 12A and 12B are schematic diagrams of the third internal layer wiring of the ground connections for the chip package using the master netlist and a subset netlist of the master netlist.
Figure 12B:
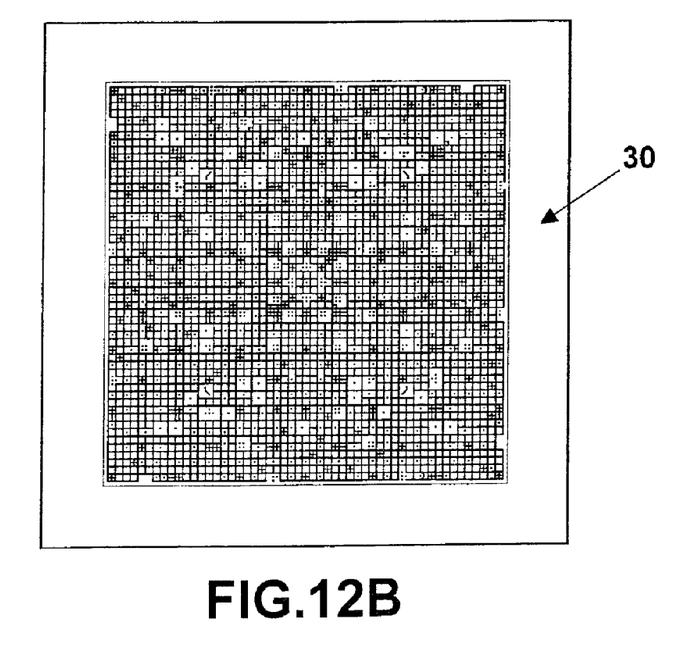
Figure 13A:
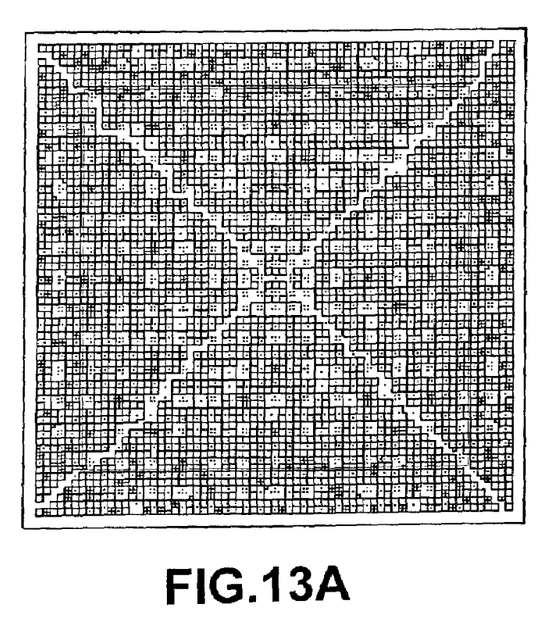
Figure 13B:
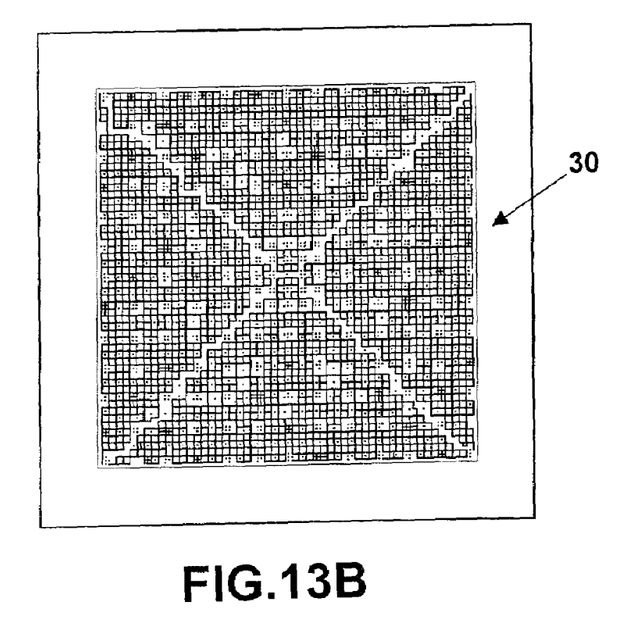
Figure 14A:
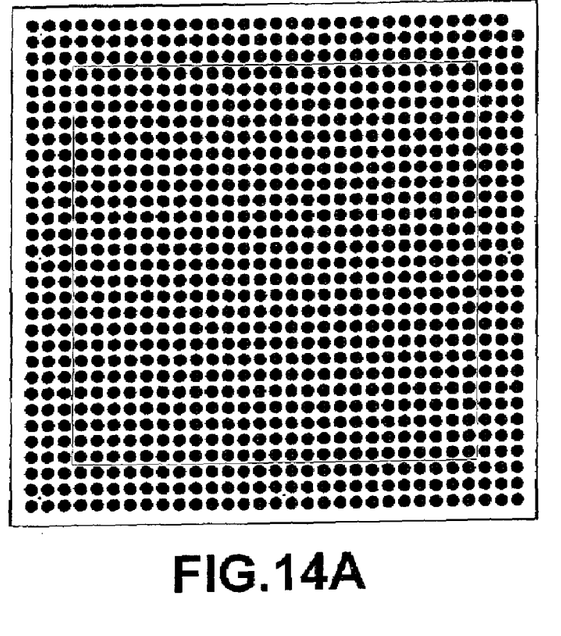
FIGS. 14A and 14B are schematic diagrams of the BSM array pattern for the chip package using the master netlist and a subset netlist of the master netlist.
Figure 14B:
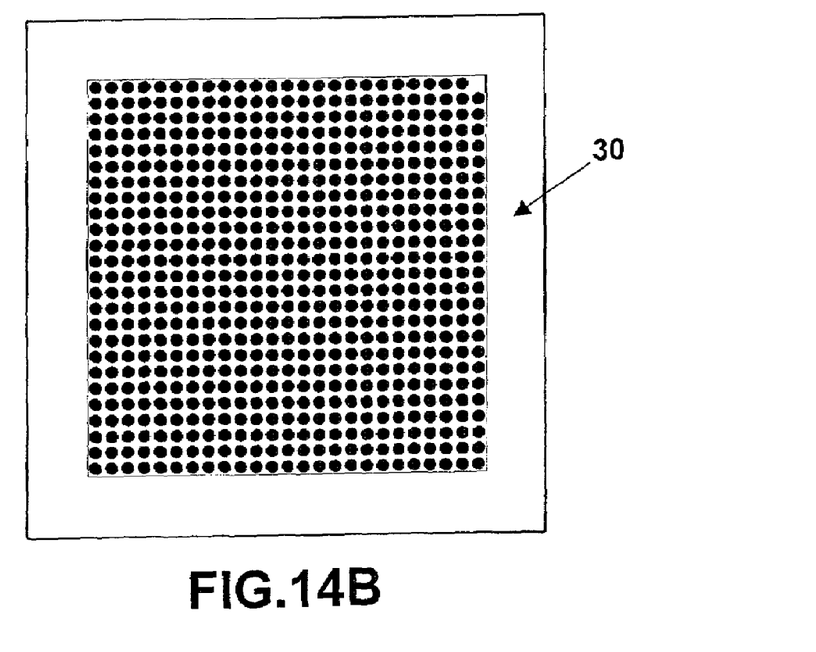

FIGS. 2A and 2B show internal wiring net lists within chip packages (substrates). The net list in FIG. 2A is the master substrate, while the one shown in FIG. 2B is a subset of the master shown in FIG. 2A. As can be seen by comparing FIGS. 2A and 2B, the designs are identical except that the outer portion (peripheral portions) of the master design in FIG. 2A has been eliminated from the subset design in FIG. 2B. The substrate shown in FIG. 2A is substantially larger and would be useful with a substantially larger chip than the substrate shown in FIG. 2B. The package of FIG. 2B can be designed in just a few hours by simple programmatic deletion of the external most unneeded nets in 2A. A fresh design of the package shown in FIG. 2B would otherwise require about two weeks. So again, the invention provides a design methodology improvement which results from design reuse, predicated upon two features of the invention: 1) logical super-netlist employing a master or super-substrate (e.g., largest supportable netlist for the chip and package combination) method; and 2) physical super-topology employing uncrossed physical nets, deleting unneeded nets from the outermost die I/O first and proceeding inward as required.

FIGS. 3A-14B represent the various layers within two different substrates (chip packages). More specifically, the "A" figures represent the master substrate while the "B" figures represent a subset of the master within the same menu. FIGS. 3A-3B and 14A-14B represent the top and bottom of the substrate, respectively. FIGS. 4A-13B illustrate the successive layers within the substrate.

As can be seen by comparing the "A" and "B" figures within each layer of the different substrates, the electrical connections and wiring positions are identical for the master and the subset except that the subset does not include the peripheral region 30 that is included within the master substrate. As explained above, this allows the subsets of the master to be very easily and quickly designed, which produces cost savings and reduces the time it takes to bring a product to market. The substrate or package designer can leverage the invention, new design re-use methodology, to derive subordinate logical netlists and substrates/packages quickly and easily, saving time and money.

The master design represents the largest possible logical netlist and largest physical wiring possible for the given die and package combination. Further, the logical netlist is not changed or revised in any way except that programmatic (e.g., from the outermost I/O proceeding inboard, in series, as required) deletions are allowed. Thus, the derived subordinate netlist/package is an exact identical subset of the parent master netlist/package. The comparison of the A and B figures in each case show how, for each layer, the subset chip package (B) is derived simply by the deletion of wiring on each layer from the master chip package (A).

The invention discloses a hierarchical system of congruent logical and topological coherence chip package that has a master substrate and at least one subset substrate of the master substrate. The master substrate has the largest logical and physical rendition supportable by the chip packages. The subset substrate is derived by programmatic deletion of unneeded nets from the master substrate. Congruent chip packages mean that for a given menu of chip packages having at least one master chip package and a derived, smaller chip package, all of the wiring nets of the derived, smaller chip package are common to, and congruent (i.e., coincident) with, a subset of the wiring nets of the master chip package.

Thus, as explained above, when different sizes of chips from the same family are placed on multiple substrate sizes, the invention designs the substrate with the largest body size first. Designs for the smaller body sizes are then subsets of the initial design. The bottom surface pad assignments for each physical location are made common between each substrate size to enable this sharing of design structures to produce the cost and time savings associated with the invention.

Traditionally, each substrate design has been done from scratch, which utilizes much more design resources, and requires a long cycle time to produce each design or netlist. With the invention, the subset netlists can be delivered to the customer much more quickly, by just running through a program to obtain the subset netlist, and the smaller designs can quickly be obtained, reducing the design cycle time.

While the invention has been described in terms of preferred embodiments, those skilled in the art will recognize that the invention can be practiced with modification within the spirit and scope of the appended claims.

What is claimed is:

1. A hierarchical system of chip packages comprising:
   a master chip package; and
   at least one subset chip package of said master chip package, wherein said subset chip package comprises a congruent logical and topologically coherent portion of said master chip package, wherein said subset chip package has a pin out pattern commensurate to said portion of said master chip package and said subset chip package has identical internal net lists as said portion of said master chip package, such that said subset chip package is both a logical and physical subset of the master chip package, and wherein said master chip package and said subset chip package are not connected wherein said master chip package comprises the largest logical and physical rendition supportable by said chip packages and said subset chip package is derived by programmatic deletion of unneeded nets from said master chip package.

2. The system in claim 1, wherein said subset chip package is adapted to accommodate a smaller chip than said master chip package.

3. The system in claim 1, wherein said master chip package is the largest chip package in said hierarchical system.

4. A hierarchical system of chip packages comprising:
   a master chip package; and
   at least one subset chip package of said master chip package, wherein said master chip package comprises the largest logical and physical rendition supportable by said chip packages; and wherein said subset chip package substrate has a pin out pattern commensurate to said portion of said master chip package, such that said subset chip package is both a logical and physical subset of the master chip package, wherein said subset chip package has identical internal net lists as said portion of said master chip package; and
   said subset chip package comprises a congruent logical and topologically coherent portion of said master chip package and is derived by programmatic deletion of unneeded nets from said master chip package, wherein said master chip package and subset chip package are not connected.

5. The system in claim 4, wherein said subset chip package is adapted to accommodate a smaller chip than said master chip package.

6. The system in claim 4, wherein said master chip package is the largest chip package in said hierarchical system.

7. A method of forming a hierarchical system of chip packages, said method comprising:
   designing a master chip package having wiring nets; and
   designing at least one smaller subset chip package of said master chip package by programmatically deleting unneeded wiring nets from said master chip package such that said subset chip package is both a logical and physical subset of the master chip package, wherein the master chip package and subset chip package are not connected, wherein said subset chip package comprises a congruent logical and topologically coherent portion of said master chip package, wherein said subset chip package has a pin out pattern commensurate to said portion of said master chip package, wherein said subset chip package has identical wiring nets as said portion of said master chip package.

8. The method in claim 7, wherein said subset chip package is adapted to accommodate a smaller chip than said master chip package.

9. The method in claim 7, wherein said master chip package is the largest chip package in said hierarchical system.

10. The method in claim 7, wherein said master chip package comprises the largest logical and physical rendition supportable by said chip packages.

* * * * *